(12) United States Patent
Sonehara et al.

(10) Patent No.: US 8,008,963 B2
(45) Date of Patent: Aug. 30, 2011

(54) ANALOG SWITCH

(75) Inventors: Masahito Sonehara, Mito (JP);
Yoichiro Kobayashi, Ome (JP)

(73) Assignee: Hitachi, Ltd., Tokyo (JP)

( * ) Notice: Subject to any disclaimer, the term of this patent is extended or adjusted under 35 U.S.C. 154(b) by 16 days.

(21) Appl. No.: 12/128,637

(22) Filed: May 29, 2008

(65) Prior Publication Data

US 2008/0296685 A1  Dec. 4, 2008

(30) Foreign Application Priority Data

May 31, 2007  (JP) ................................. 2007-144355

(51) Int. Cl.
*H03K 17/687* (2006.01)
(52) U.S. Cl. ........................................ 327/427; 327/365
(58) Field of Classification Search .................. 327/365, 327/376, 377, 427
See application file for complete search history.

(56) References Cited

U.S. PATENT DOCUMENTS

| 5,933,046 | A | * | 8/1999 | Ramet et al. | ................... | 327/534 |
| 6,163,199 | A | * | 12/2000 | Miske et al. | ................... | 327/434 |
| 6,462,611 | B2 | * | 10/2002 | Shigehara et al. | ............. | 327/534 |
| 6,828,846 | B2 | * | 12/2004 | Tsukazaki et al. | ............. | 327/404 |
| 7,385,439 | B2 | * | 6/2008 | Makino et al. | ................. | 327/558 |

FOREIGN PATENT DOCUMENTS

| JP | 6-169247 A | 6/1994 |
| JP | 2002-135099 A | 5/2002 |

* cited by examiner

*Primary Examiner* — Hai L Nguyen
(74) *Attorney, Agent, or Firm* — Miles & Stockbridge P.C.

(57) ABSTRACT

An analog switch having a low capacitance is achieved. Potentials of input/output terminals of the analog switch and a well potential and a gate potential of an NMOS switching device are operated in synchronization via level shift buffers, thereby cancelling parasitic capacitances present between these elements.

17 Claims, 8 Drawing Sheets

ANALOG SWITCH

CROSS-REFERENCE TO RELATED APPLICATION

The present application claims priority from Japanese Patent Application No. JP 2007-144355 filed on May 31, 2007, the content of which is hereby incorporated by reference into this application.

FIELD OF THE INVENTION

The present invention relates to an analog switch using a MOS field effect transistor (MOSFET) as a switching device. More particularly, the present invention relates to an analog switch using a MOS relay circuit and circuits using the MOS relay circuit.

BACKGROUND OF THE INVENTION

Japanese Patent Application Laid-Open Publication No. H06-169247 (Patent Document 1) discloses an example of a circuit in which a PMOS and an NMOS are connected in parallel as a switching device, which mainly aims to reduce a conducting resistance by controlling a well potential.

Japanese Patent Application Laid-Open Publication No. 2002-135099 (Patent Document 2) discloses an example of a circuit in which a PMOS and an NMOS are connected in parallel as a switching device and a gate potential and a well potential are controlled, and which mainly aims to prevent a current inflow when applying a high voltage upon turning off the power.

SUMMARY OF THE INVENTION

To pass data in high speed by means of an analog switch using a MOSFET, it has been required to reduce a capacitance seen from input/output terminals of a switch. The inventors of the present invention studied prior to the present application about reducing the capacitance seen from the input/output terminals by controlling a gate potential and a well potential of the MOSFET.

A technique for controlling a well potential of a MOSFET is shown in FIG. 2 of Patent Document 1. However, as to the circuit, it is not taken into account a capacitance between well-substrate seen through a circuit for controlling the well potential, and a fixed gate potential is applied. Accordingly, the inventors of the present application have found that the technique of Patent Document 1 is difficult to reduce the capacitance seen from the input/output terminals.

A technique for controlling a gate potential and a well potential of a MOSFET is shown in FIG. 1 of Patent Document 2. However, the circuit operates according to a high voltage exceeding a power voltage applied thereto upon turning off the power, and turning on the power nor an input within a range of the power voltage is not taken into account. Accordingly, the inventors of the present application have found that the technique of Patent Document 2 is difficult to reduce the capacitance seen from the input/output terminals.

The typical ones of the present inventions will be described as follows. More particularly, an analog switch of the present invention comprises: a MOSFET having a source, drain, gate, and well as terminals; a switch input terminal connected to any one of the source and drain, and a switch output terminal connected to the other one of the source and drain; a switch control terminal connected to the gate directly or indirectly, and to which a potential for maintaining an electrical conduction between the switch input terminal and the switch output terminal to ON state or OFF state is applied; and a level shift buffer which has an input terminal connected to the switch output terminal directly or indirectly and an output terminal connected to at least any one of the gate and the well, and makes at least any one of a potential of the gate (gate potential) and a potential of the well (well potential) follow a potential of the switch output terminal.

Herein, the analog switch of the present invention is formed by a MOSFET of P-type or N-type. The analog switch may be formed to have both a gate-potential level shift buffer which makes a gate potential follow a potential of one of a source and drain of the MOSFET, and a well-potential level shift buffer which makes a well potential follow a potential of one of a source and drain of the MOSFET. Alternatively, the analog switch may be formed to have only one of the gate-potential level shift buffer and the well-potential level shift buffer.

According to the present invention, it is possible to reduce a capacitance seen from input/output terminals of an analog switch using a MOSFET.

BRIEF DESCRIPTIONS OF THE DRAWINGS

DETAILED DESCRIPTION OF THE PREFERRED EMBODIMENTS

Hereinafter, embodiments of the present invention will be described in detail with reference to the accompanying drawings. Circuit elements composing respective blocks of the embodiments are not particularly limited, and are formed on one semiconductor substrate of such as single crystal silicon by a well-known technology for integrated circuits such as CMOS (complementary MOS) transistor.

First Embodiment

Figure 1:
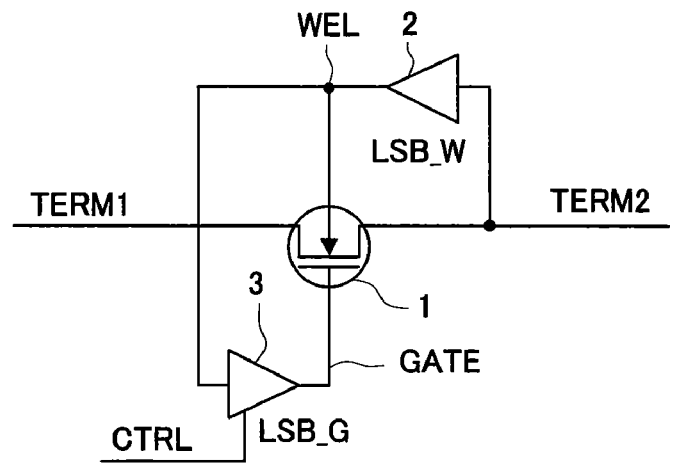
FIG. 1 is a configuration diagram showing a first embodiment of the present invention.

FIG. 1 is a configuration diagram showing a first embodiment of the present invention. A present analog switch has TERM1 and TERM2 as input/output terminals and comprises: an NMOS switching device 1; a well-potential level shift buffer 2 which shifts a potential of TERM2 and outputs a well potential not making a diode between TERM2-well in forward-biased; and a gate-potential level shift buffer 3 which shifts an potential from an input and outputs a gate potential which makes the NMOS switching device 1 have a sufficiently low conducting resistance at CTRL=H at which the analog switch becomes ON state, and makes the NMOS switching device 1 to OFF at CTRL=L at which the analog switch becomes OFF state. Note that, the well-potential level shift buffer 2 and the gate-potential level shift buffer 3 are not indispensable components in the present embodiment, and configurations shown in FIG. 2 to FIG. 4 are applicable.

Figure 2:
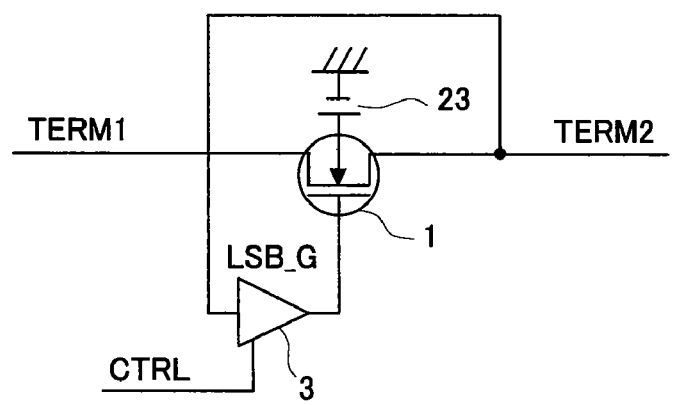
FIG. 2 shows an example of configuration options of FIG. 1.

FIG. 2 is a configuration diagram in which the well-potential level shift buffer 2 of FIG. 1 is omitted, and the well potential is applied by a fixed potential 23, which is one of options of the first embodiment.

Figure 3:
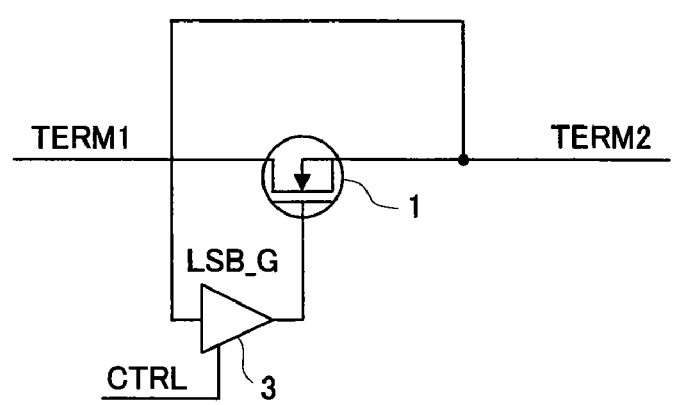
FIG. 3 shows an example of configuration options of FIG. 1.

FIG. 3 is a configuration diagram in which the well-potential level shift buffer 2 of FIG. 1 is omitted, and the well potential is applied by TERM2, which is one of options of the first embodiment.

Figure 4:
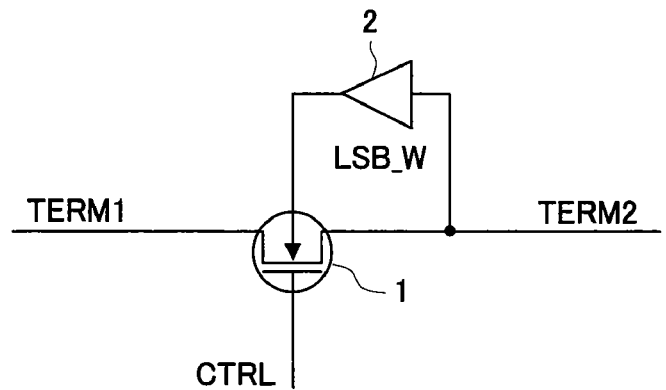
FIG. 4 shows an example of configuration options of FIG. 1.

FIG. 4 is a configuration diagram in which the gate-potential level shift buffer 3 of FIG. 1 is omitted, and the gate potential of the NMOS switching device is applied by CTRL, which is one of options of the first embodiment.

Figure 5:
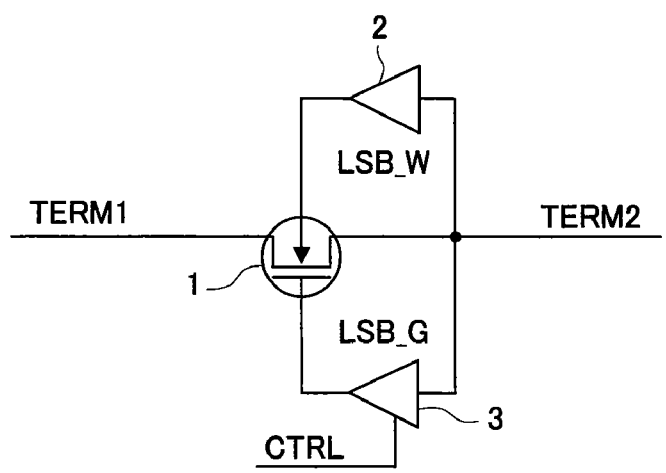
FIG. 5 shows an example of configuration options of FIG. 1.

FIG. 5 is a configuration diagram in which the input of the gate-potential level shift buffer 3 of FIG. 1 is changed from the output of the well-potential level shift buffer 2 to TERM2, which is one of options of the first embodiment.

Figure 6:
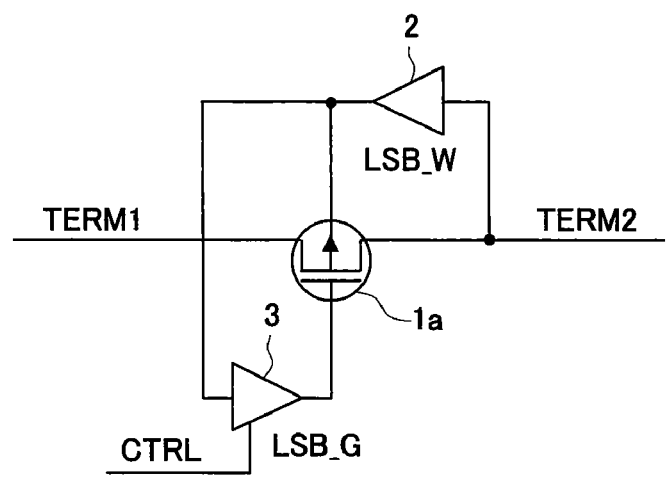
FIG. 6 shows an example of configuration options of FIG. 1.

FIG. 6 is a configuration diagram in which the NMOS switching device 1 of FIG. 1 is replaced by a PMOS switching device 1a, which is one of options of the first embodiment. And, the NMOS switching device 1 of FIG. 2 to FIG. 5 can be also replaced by a PMOS.

Figure 7:
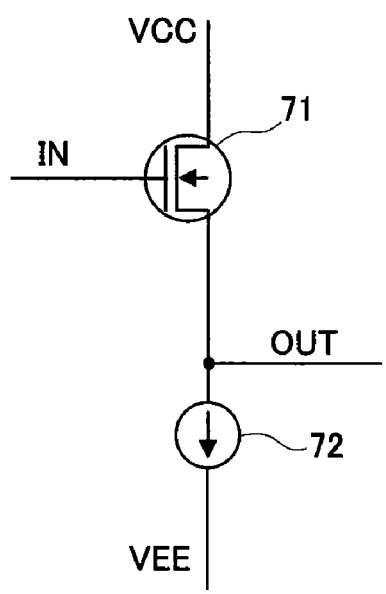
FIG. 7 shows an example of a circuit of a level shift buffer 2 in FIG. 1.

FIG. 7 shows an example of a circuit of the well-potential level shift buffer 2 according to the first embodiment. A terminal "IN" serves as an input, and the input is outputted to a terminal "OUT" by a source follower formed by the NMOS 71 and a current source 72.

Figure 8:
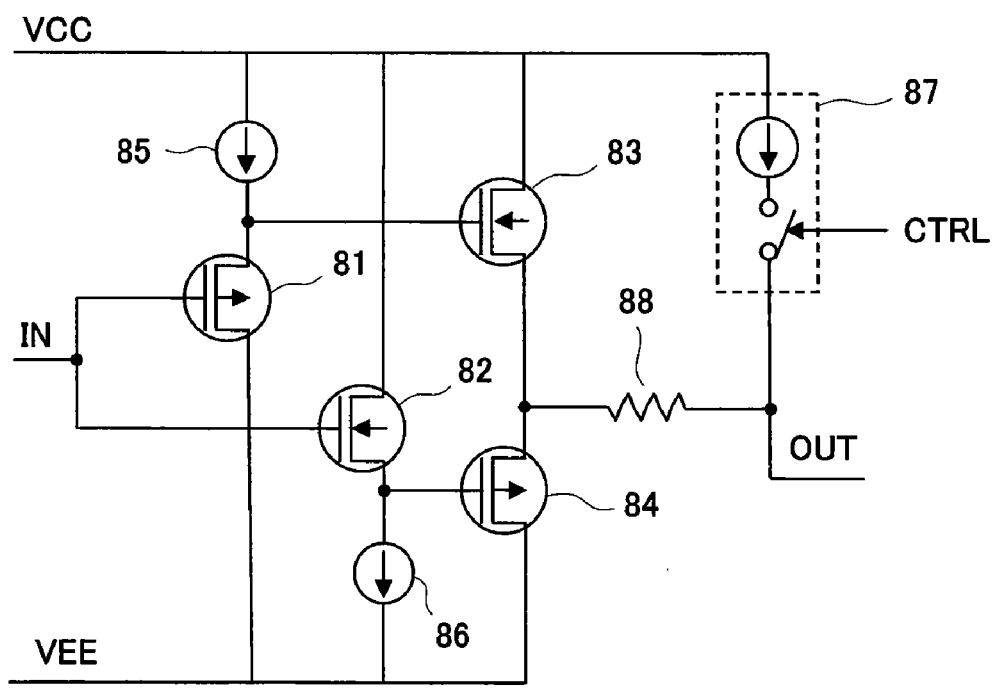
FIG. 8 shows an example of a circuit of a level shift buffer 3 in FIG. 1.

FIG. 8 shows an example of a circuit of the gate-potential level shift buffer 3 according to the first embodiment. The gate-potential level shift buffer 3 comprises: an input terminal "IN"; an output terminal "OUT"; MOSFET 81 to MOSFET 84; a push-pull circuit formed by current sources 85 and 86; a current source 87 which feeds a current at CTRL=H and makes the current OFF at CTRL=L; and a resistor element 88 which gives a gate potential of the NMOS switching device 1 of FIG. 1 by the current at CTRL=H.

Figure 9:
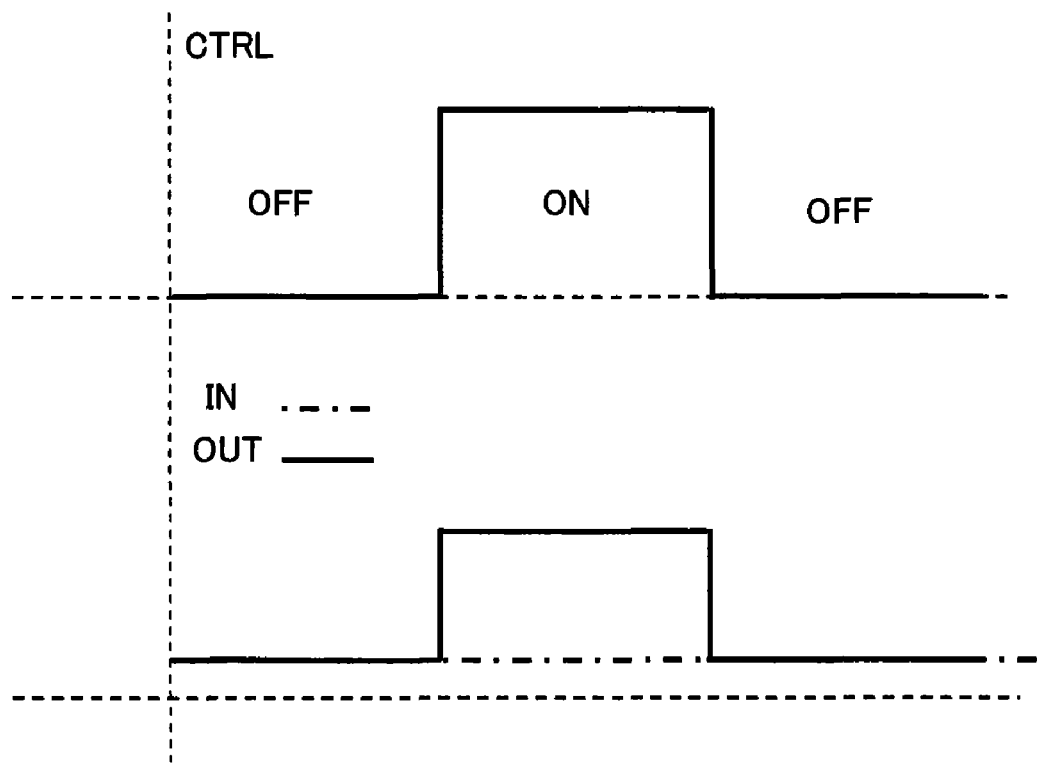
FIG. 9 is a timing chart of the circuit of FIG. 8.

FIG. 9 shows a timing chart of the circuit shown in FIG. 8. When the switch is OFF, the output terminal OUT outputs a potential same as that of the input terminal IN at a control signal CTRL=L. When turning ON the switch, the control signal becomes CTRL=H, and the output terminal OUT outputs a potential of that of the input terminal IN added by a product of a current value of the current source 87 and a resistance value of the resistor element 88. A potential difference between ON and OFF becomes a voltage required to turn ON the NMOS switching device.

Figure 10:
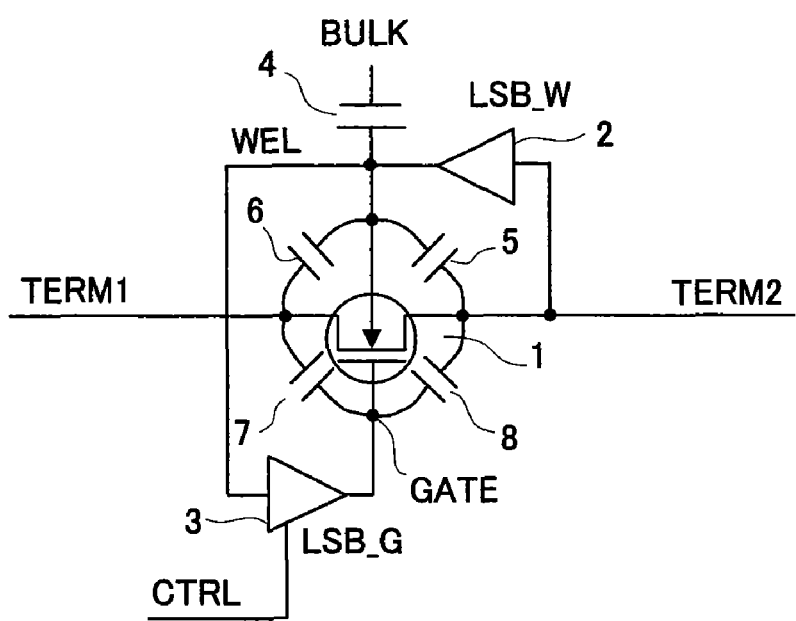
FIG. 10 is a circuit diagram showing an effect of the configuration of FIG. 1.

FIG. 10 shows a circuit for describing an effect of the circuit according to the first embodiment. Capacitances 4 to 8 are parasitic to the NMOS switching device 1 of FIG. 1. When the switch is ON, a potential of TERM1, a potential of TERM2, the well potential, and the gate potential are synchronized by the well-potential level shift buffer 2 and the gate-potential level shift buffer 3, thereby cancelling the parasitic capacitances 5 to 8 as capacitances and reducing the capacitance seen from the input/output terminals TERM1 and TERM2. Further, the parasitic capacitance 4 between the well-substrate is reduced as a capacitance seen from TERM2, because it is driven by the well-potential level shift buffer 2.

When the switch is OFF, while the parasitic capacitances 6 and 7 relating to TERM1 are not cancelled, the potential of TERM2, the well potential, and the gate potential are synchronized, thereby cancelling the parasitic capacitances 5 and 8.

Figure 11:
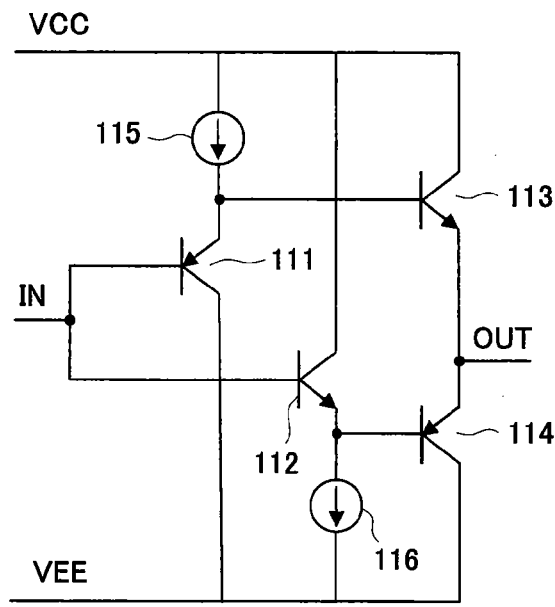
FIG. 11 is a circuit diagram showing an optional circuit for improving the effect of the configuration of FIG. 1.

FIG. 11 shows an example of a circuit for improving the effect of reducing the capacitance seen from the input/output terminals according to the first embodiment. An input is given to the terminal IN, and it is outputted to the terminal OUT by a push-pull circuit formed by the current sources 115 and 116. The circuit is inserted in series behind the well-potential level shift buffer 2, thereby improving a driving performance and reducing an influence from the input/output terminals of the well-substrate capacitance 4 in FIG. 10. Note that, the circuit is not an indispensable component, and so it can be omitted.

As described in the foregoing, according to the first embodiment, junction capacities of the MOSFET seen between TERM1-Gate, TERM2-Gate, TERM1-WEL, and TERM2-WEL are not electrically apparent, thereby achieving a wider bandwidth of the analog switch.

Second Embodiment

Figure 12:
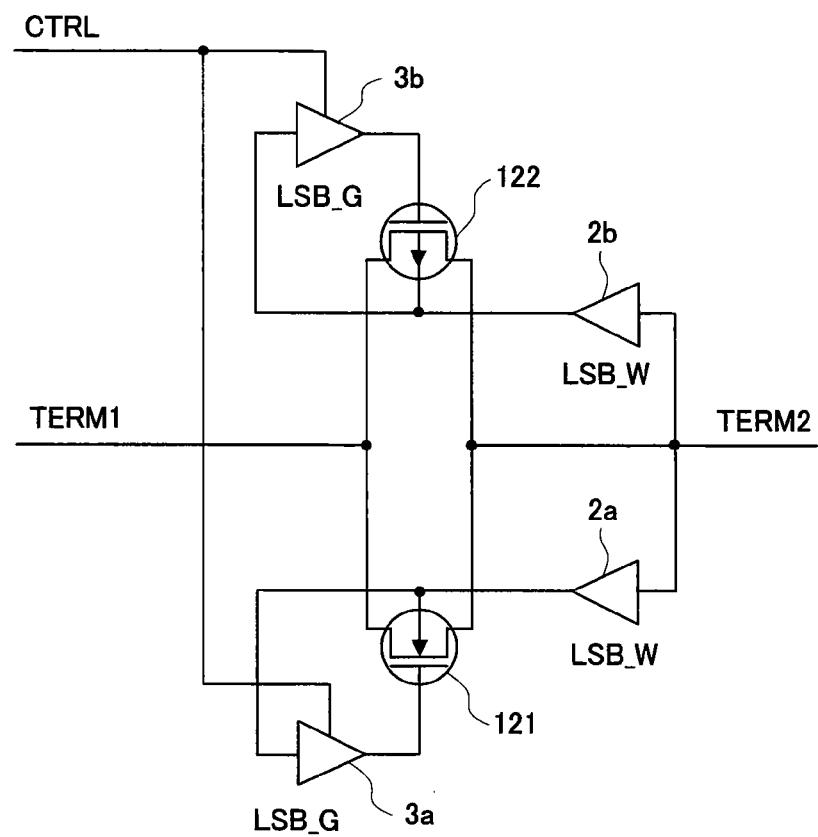
FIG. 12 is a configuration diagram showing a second embodiment of the present invention.

FIG. 12 shows a configuration diagram of a second embodiment of the present invention. The NMOS switching device 1 of FIG. 1 in the first embodiment is replaced by an NMOS switching device 121 and a PMOS switching device 122 in the configuration, and the configuration is formed by the well-potential level shift buffers 2a and 2b which apply a well potential to the respective switching devices, and the gate-potential level shift buffers 3a and 3b which apply a gate potential to the respective switching devices. On the contrary to the first embodiment, a dependency to the potential applied to the input/output terminals of the conducting resistance is suppressed. Note that, in the present embodiment, the level shift buffers 2a, 2b, 3a, 3b are not indispensable components, and a configuration in which the level shift buffers are omitted is applicable as with the first embodiment.

As described in the foregoing, according to the second embodiment, a dependency to the potential applied to the input/output terminals of the conducting resistance can be suppressed.

Third Embodiment

Figure 13A:
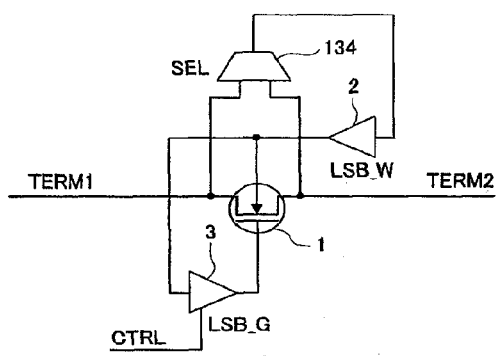
FIGS. 13A and 13B are configuration diagrams showing a third embodiment of the present invention.
Figure 13B:
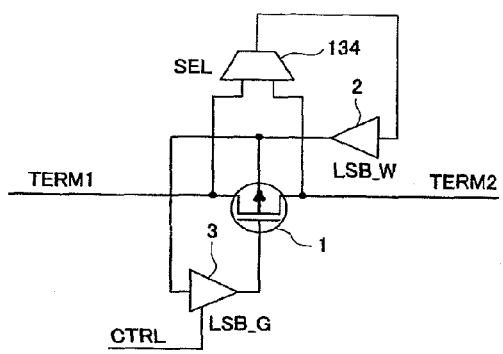

FIGS. 13A and 13B show configuration diagrams of a third embodiment of the present invention. In the configuration, the input of the well-potential level shift buffer 2 in FIG. 1 is changed to an output of a selector 134 which selects one having lower potential from two inputs. In this manner, the well potential and the gate potential of the NMOS switching device 1 can be synchronized with one having lower potential of TERM1 and TERM2. In FIG. 1 of the first embodiment, the well potential and the gate potential are synchronized with only TERM2, it is required to make TERM2 have a lower potential than TERM1 when the switch is OFF. When taking a drain-source withstand voltage of the NMOS switching device 1 as BVds, a potential Vterm2 of TERM2 is required to have a relation with a potential Vterm1 of TERM1 as Vterm1−BVds≦Vterm2≦Vterm1 in FIG. 1. On the contrary, the relation becomes as Vterm1−BVds≦Vterm2≦Vterm1+BVds in FIGS. 13A and 13B, thereby relaxing a potential setting range of the input/output terminals during the switch is OFF.

The well-potential level shift buffer 2 and the gate-potential level shift buffer 3 in FIGS. 13A and 13B are not indispensable components, and thus a configuration in which the level shift buffers are omitted is applicable as with the first embodiment. Further, as with the first embodiment, the NMOS switching device 1 (FIG. 13A) can be replaced by a PMOS switching device (FIG. 13B), or replaced by a parallel connection of the NMOS switching device and the PMOS switching device as with the second embodiment.

Figure 14:
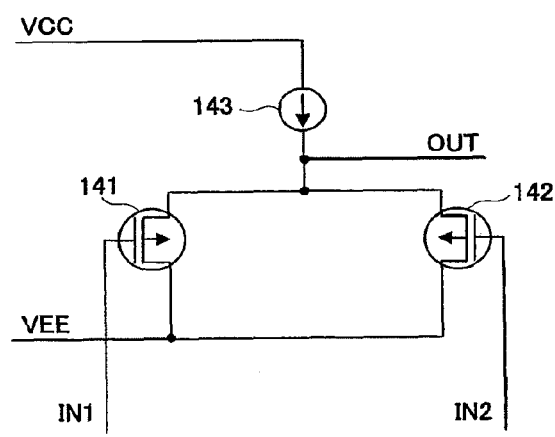
FIG. 14 is an example of a circuit of SEL 134 of FIGS. 13A and 13B.

FIG. 14 shows an example of a circuit of the selector 134 of FIGS. 13A and 13B. In a differential circuit formed by PMOS 141 and PMOS 142 and a current source 143, a signal synchronized with one having lower potential of two inputs IN1 and IN2 is outputted to the terminal OUT.

As described in the foregoing, according to the third embodiment, the potential setting range of the input/output terminals during the switch is OFF can be enhanced.

Fourth Embodiment

Figure 15:
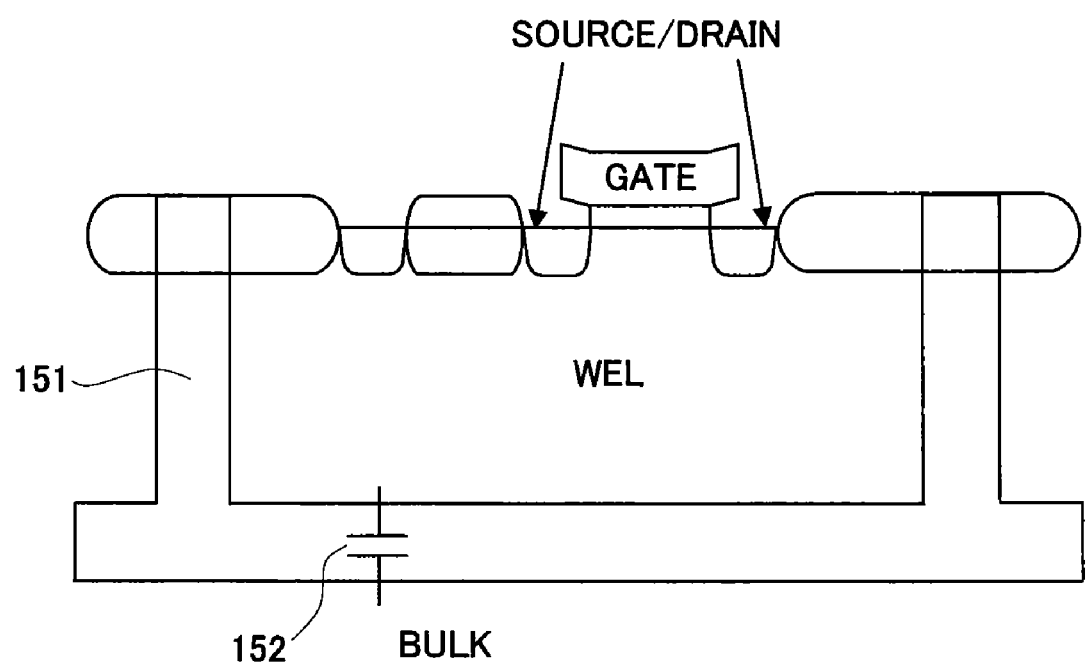
FIG. 15 is a diagram showing a longitudinal structure of SOI for describing a fourth embodiment of the present invention.

FIG. 15 shows a longitudinal structure of SOI substrate. A fourth embodiment is made by isolating the WEL of the MOSFET in the first to third embodiments by SOI. The well of the MOSFET is isolated by an SOI layer 151 having a low dielectric constant, thereby reducing the capacitance 152 between the well-substrate and achieving an effect of reducing the capacitance seen from the input/output terminals and a mixed mounting of elements of other processes. Therefore, it contributes to widen an applicable range of the present invention. Note that, the SOI isolation is not an indispensable component, and the present invention can be achieved even when the SOI isolation is not used.

As described in the foregoing, according to the fourth embodiment, the capacitance between the well-substrate can be reduced, thereby widening the bandwidth of the analog switch.

Fifth Embodiment

Figure 16:
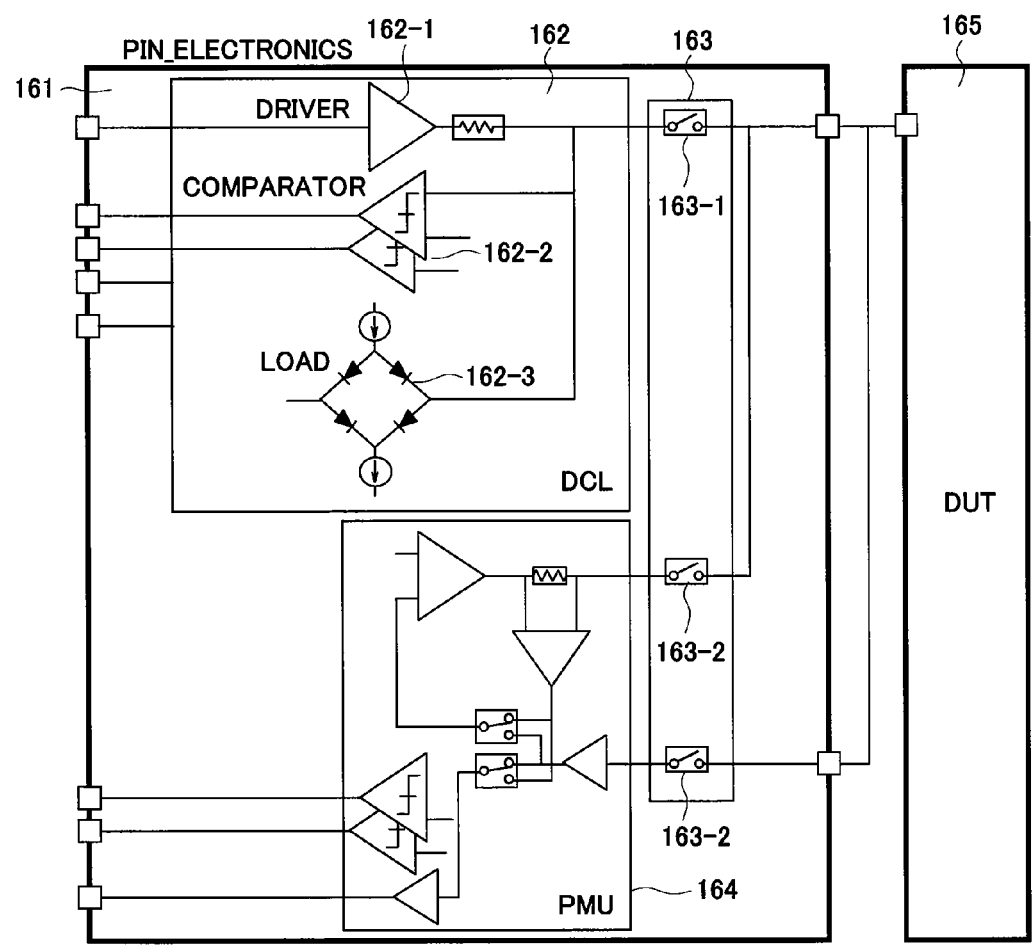
FIG. 16 is a schematic diagram of a pin electronics device to which the present invention is mainly applied.

FIG. 16 is a diagram showing the present invention applied to a pin electronics 161. This is an example of applications of the present invention. The pin electronics 161 which measures voltage/current applied to a DUT 165 as a measured target and output voltage/current comprises: a DCL 162 having a driver 162-1 which applies a voltage of AC or DC to the DUT 165, a comparator 162-2 which compares an output voltage of AC or DC of the DUT 165, and a load 162-3 which supplies current load; a PMU 164 which applies voltage/current to the DUT 165 and compares input/output voltages/currents of the DUT 165 with set values; and a switch 163 which connects and separates the DCL 162 and PMU 164 with/from the DUT 165. The analog switch of the present invention is applied to a pin electronics which drives data in high speed, thereby enabling replacement of a mechanical relay switch by an analog switch of MOSFET. Therefore, the pin electronics 161 which is highly integrated and drives data in high speed can be achieved.

When the switch 163-1 is conducted and the switches 163-2 and 163-3 are not conducted during the driver is operated, the fifth embodiment of the present invention is applied, thereby enhancing a potential setting range of the PMU 164 to an output potential of the driver.

As described in the foregoing, according to the fifth embodiment, a pin electronics which is highly integrated and drives data in high speed can be achieved.

According to the embodiments described in the foregoing, the junction capacitances of a MOSFET configuring an analog switch becomes less apparent, thereby obtaining wider bandwidth. Therefore, an analog switch which is highly integrated on a semiconductor substrate and has a wider bandwidth can be achieved.

What is claimed is:

1. An analog switch comprising:
a MOSFET having a source, a drain, a gate, and a well as terminals;
a switching input terminal connected to one of the source and the drain, and a switching output terminal connected to the other of the source and the drain;
a switching control terminal connected to the gate directly or indirectly, and to which a potential for maintaining an electrical conduction between the switching input terminal and the switching output terminal to an ON state or an OFF state is applied; and
a level shift buffer which has an input terminal connected to the switching output terminal directly or indirectly and an output terminal connected to at least one of the gate and the well, and which causes at least one of a gate potential and a well potential to follow a potential of the switching output terminal.

2. The analog switch according to claim 1, wherein the MOSFET comprises a single MOSFET of P-type or N-type, or a P-type MOSFET and an N-type MOSFET connected in parallel.

3. The analog switch according to claim 1, further comprising:
a selector which selects a higher potential when the MOSFET is P-type and a lower potential when the MOSFET is N-type, respectively, from both potentials of the source and the drain of the MOSFET,
wherein the level shift buffer is configured to cause at least one of the gate potential and the well potential follow the potential selected by the selector.

4. The analog switch according to claim 3, wherein the MOSFET comprises a single MOSFET of P-type or N-type, or a P-type MOSFET and an N-type MOSFET connected in parallel.

5. The analog switch according to claim 1, wherein the level shift buffer is a well-potential level shift buffer configured to cause the well potential to follow one of the potential of the source and the potential of the drain of the MOSFET.

6. The analog switch according to claim 5, wherein the MOSFET comprises a single MOSFET of P-type or N-type, or a P-type MOSFET and an N-type MOSFET connected in parallel.

7. The analog switch according to claim 5, further comprising:
a selector which selects a high potential when the MOSFET is P-type and selects a low potential when the MOSFET is N-type, respectively, from both of the potentials of the source and the drain,
wherein the well-potential level shift buffer is configured to cause the well potential follow the potential selected by the selector.

8. The analog switch according to claim 7,
wherein the MOSFET comprises a single MOSFET of P-type or N-type, or a P-type MOSFET and an N-type MOSFET connected in parallel.

9. The analog switch according to claim 1,
wherein the level shift buffer is a gate-potential level shift buffer which short-circuits the well potential to a potential of the source and which causes the gate potential to follow a potential of the source of the MOSFET.

10. The analog switch according to claim 9,
wherein the MOSFET comprises a single MOSFET of P-type or N-type, or a P-type MOSFET and an N-type MOSFET connected in parallel.

11. The analog switch according to claim 9, further comprising:
a selector which selects a high potential when the MOSFET is P-type and a low potential when the MOSFET is N-type, respectively, from both of the potentials of the source and the drain of the MOSFET,
wherein the gate-potential level shift buffer is configured to cause the gate potential to follow the potential selected by the selector.

12. The analog switch according to claim 11,
wherein the MOSFET comprises a single MOSFET of P-type or N-type, or a P-type MOSFET and an N-type MOSFET connected in parallel.

13. The analog switch according to claim 1,
wherein the level shift buffer is a gate-potential level shift buffer which causes the gate potential to follow one of potential of the source and the potential of the drain of the MOSFET.

14. The analog switch according to claim 13,
wherein the MOSFET comprises a single MOSFET of P-type or N-type, or a P-type MOSFET and an N-type MOSFET connected in parallel.

15. The analog switch according to claim 13, further comprising:
a selector which selects a high potential when the MOSFET is P-type and a low potential when the MOSFET is N-type, respectively, from both of the potentials of the source and the drain of the MOSFET,
wherein the level shift buffer for gate potential is configured to cause the gate potential to follow the potential selected by the selector.

16. The analog switch according to claim 15,
wherein the MOSFET comprises a single MOSFET of P-type or N-type, or a P-type MOSFET and an N-type MOSFET connected in parallel.

17. The analog switch according to claim 1, wherein the well of the MOSFET is isolated by SOI.

* * * * *